US012568806B2

(12) United States Patent
Mukesh et al.

(10) Patent No.: US 12,568,806 B2
(45) Date of Patent: Mar. 3, 2026

(54) CONFORMAL DIELECTRIC CAP FOR SUBTRACTIVE VIAS

(71) Applicant: International Business Machines Corporation, Armonk, NY (US)

(72) Inventors: Sagarika Mukesh, Albany, NY (US); Nicholas Anthony Lanzillo, Wynantskill, NY (US); Robert Robison, Rexford, NY (US); Ruqiang Bao, Niskayuna, NY (US); Ardasheir Rahman, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 863 days.

(21) Appl. No.: 17/563,607

(22) Filed: Dec. 28, 2021

(65) Prior Publication Data

US 2023/0207387 A1     Jun. 29, 2023

(51) Int. Cl.
| | |
|---|---|
| *H01L 23/31* | (2006.01) |
| *H01L 21/768* | (2006.01) |
| *H01L 23/532* | (2006.01) |

(52) U.S. Cl.
CPC .... *H01L 21/76832* (2013.01); *H01L 21/7682* (2013.01); *H01L 21/76834* (2013.01); *H01L 21/76837* (2013.01); *H01L 23/3171* (2013.01); *H01L 23/3192* (2013.01); *H01L 23/53295* (2013.01); *H01L 21/76885* (2013.01); *H01L 21/76897* (2013.01)

(58) Field of Classification Search
CPC ....... H01L 21/768–76898; H01L 23/31–3192; H01L 23/5329–53295
See application file for complete search history.

(56) References Cited

U.S. PATENT DOCUMENTS

| | | | |
|---|---|---|---|
| 6,577,011 B1 | 6/2003 | Buchwalter | |
| 6,653,224 B1 | 11/2003 | Gotkis | |
| 7,312,146 B2 | 12/2007 | Cheung | |
| 7,323,784 B2 | 1/2008 | Yiu | |
| 7,521,358 B2 | 4/2009 | Bright | |
| 9,076,844 B2 | 7/2015 | Bright | |
| 9,190,323 B2 | 11/2015 | Zhang | |
| 9,281,263 B2 | 3/2016 | Lee | |
| 2002/0155693 A1 | 10/2002 | Hong | |
| 2005/0112957 A1 | 5/2005 | Yang | |
| 2007/0178713 A1* | 8/2007 | Jeng | H01L 21/76814 438/787 |
| 2008/0166870 A1 | 7/2008 | Huang | |
| 2011/0100697 A1* | 5/2011 | Yang | H01L 21/76831 174/262 |
| 2017/0372947 A1* | 12/2017 | King | H01L 21/76829 |
| 2020/0083345 A1* | 3/2020 | Canaperi | H10D 30/024 |

* cited by examiner

Primary Examiner — Sue A Purvis
Assistant Examiner — Aneta B Cieslewicz
(74) Attorney, Agent, or Firm — Kimberly Zillig

(57) ABSTRACT

Embodiments of the present disclosure provide a semiconductor structure including a first metal contact, where at least a portion of the first metal contact extends vertically from a substrate to a top portion of the semiconductor structure. The first metal contact having an exposed surface at the top portion of the semiconductor structure. A dielectric cap may be configured around the first metal contact. The dielectric cap is configured to electrically separate a first area of the semiconductor structure from a second area of the semiconductor structure. The first area of the semiconductor structure includes the first metal contact.

8 Claims, 13 Drawing Sheets

300

108

110

126   126   126

101

CONFORMAL DIELECTRIC CAP FOR SUBTRACTIVE VIAS

BACKGROUND

Aspects of the present disclosure relate generally to the field of semiconductor devices, and more particularly, to back-end-of-line (BEOL) structures and methods associated with the formation of such structures.

Integrated chips (IC) and the associated semiconductor structures are typically fabricated with a BEOL interconnect structure. Such BEOL interconnect structures often comprise multiple levels of metal lines and inter-level vias that may be used to connect various IC components and devices.

SUMMARY

A first aspect of the present disclosure provides a semiconductor structure including: a first metal contact, wherein at least a portion of the first metal contact vertically extended from a substrate to a top portion of the semiconductor structure, the first metal contact having an exposed surface at the top portion of the semiconductor structure, a dielectric cap configured around the first metal contact, wherein the dielectric cap is configured to electrically separate a first area of the semiconductor structure from a second area of the semiconductor structure, and wherein the first area of the semiconductor includes the first metal contact.

A second aspect of the present disclosure provides a method of forming semiconductor structure, the method including: forming one or more exposed portions of a substrate and one or more metal contacts from a metal sheet configured on the sub state, wherein the one or more metal contacts extend vertically from the substrate; forming a dielectric cap over the one or more exposed portions of substrate and the one or more metal contacts; backfilling a low-k dielectric backfill layer over the dielectric cap; and revealing an exposed contact portion of the one or more metal contacts, wherein the exposed contact portion is proximate a top portion of the semiconductor structure.

A third aspect of the present disclosure provides a semiconductor structure, the semiconductor structure including: forming one or more exposed portion of a substrate and one or more metal contacts from a metal sheet configured on the sub state, wherein the one or more metal contacts, having a first surface portion and a second surface portion, extend vertically from the substrate; forming an ultra low-k (ULK) dielectric layer anisotropically over the one or more exposed portions of the substrate and over the first surface portion of the one or more metal contacts, wherein the ULK dielectric layer is not formed on the second surface portion of the one or more metal contacts; forming a dielectric cap over the ULK dielectric layer and the second surface portion of the one or more metal contacts; backfilling a low-k dielectric backfill layer over the dielectric cap; and revealing an exposed contact portion of the one or more metal contacts, wherein the exposed contact portion is proximate a top portion of the semiconductor structure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
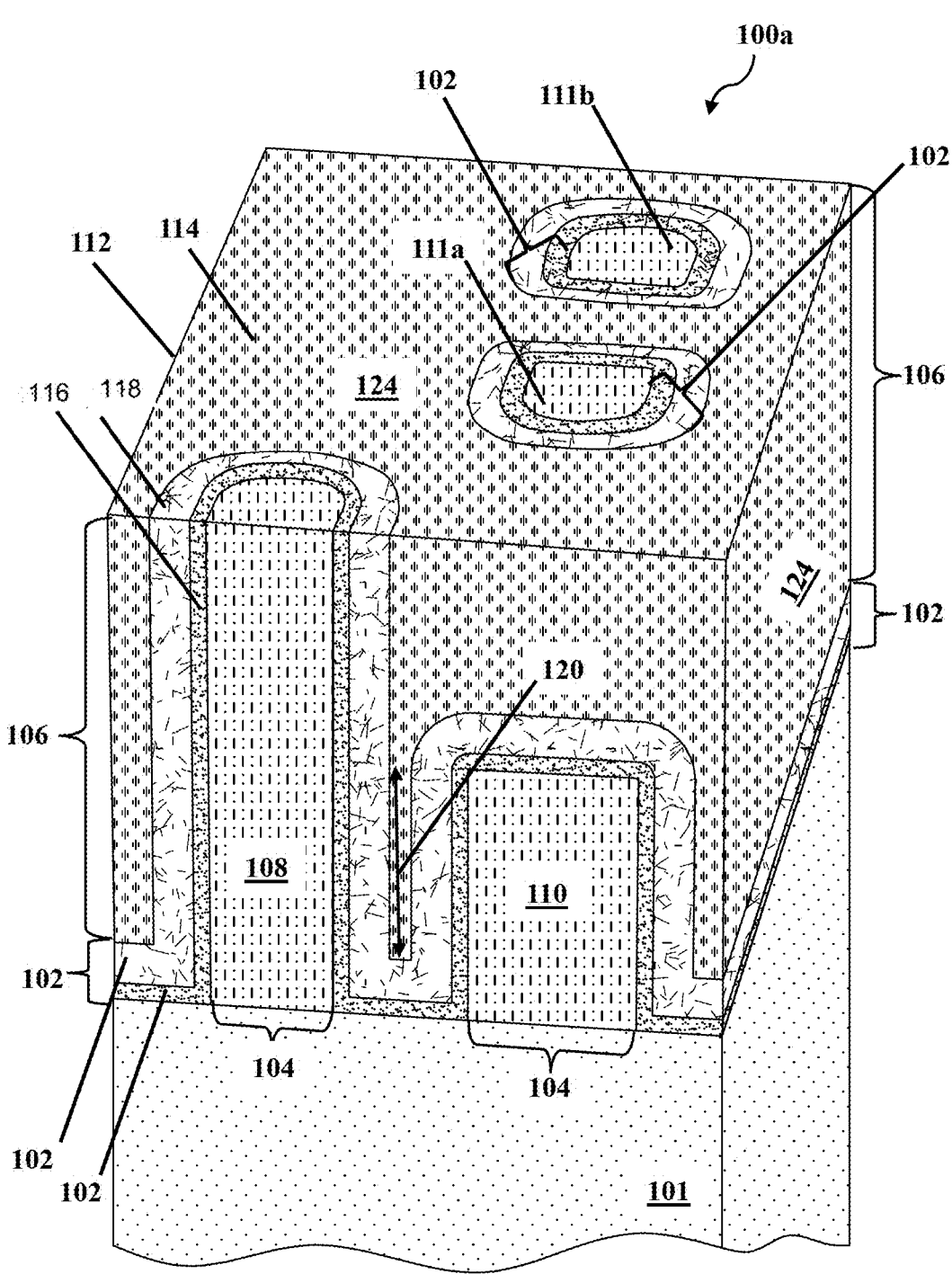
FIG. 1A depicts a schematic view of a semiconductor structure, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of semiconductor devices, and more particularly, to back-end-of-line (BEOL) structures and methods associated with the formation of such structures. In traditional damascene trenches and dual damascene vias (e.g., semiconductor structures), a dielectric cap layer is often deposited on top of the associated metal lines (e.g., opened during the etching process). These traditional dielectric caps not only act as an etch stop layer when etching the vias and lines (e.g., metal contacts), but also act as a hermetic seal that prevents the diffusion of metal ions (e.g., Cu diffusion) and the dispersion of oxygen between different levels of the structure. In some processes, such as subtractive flow and top via fabrication, such traditional approaches may be difficult to implement. For example, in subtractive flow and top via fabrication, a sheet of metal is deposited on a substrate with areas/regions have portions etched out that are not intended to be a metal line or via. While such processing may be beneficial for halting trench etches, often the points of the contact between the above vias and lines will have a very high resistance. This high resistance is extremely undesirable. As such, there is a need for the formation of a dielectric cap that may be used in subtractive flows and/or top via fabrication.

Embodiments contemplated herein provide solutions in the form of a structure and method for forming a dielectric cap that can be formed after the lines, cuts, and vias (e.g., metal contacts) are formed, but before a replacement ultra low-k dielectric backfill layer is deposited. The embodiments associated with the dielectric cap structure and method of formation provided herein conformally surrounds the subtracted via (e.g., top via) and serves as a hermetic seal. In addition, side walls of the via are protected by thick dielectric. This configuration enables the size of via CD to be increased without a possible line short. This results in a significant decrease in resistance without impacting the $V_{max}$ of the semiconductor device. The thick dielectric encapsulation resulting from dielectric cap structure and formation contemplated herein enables higher operating $V_{max}$ levels. Such dielectric cap structures may be useful in high-performance computing (HPC) applications and analog computing where higher operating $V_{max}$ levels are required, or in I/O applications where high driving current is often required.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about," "substantially," or "approximately" as used herein with regard to thicknesses, widths, percentages, ranges, etc., are meant to denote being close or approximate to, but not exactly. For example, the term "about," "substantially," or "approximately" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" or "connected" can include both an indirect "connection" and a direct "connection." The terms "on" or "onto" with respect to placement of components relative to the semiconductor structure or stack is not to be interpreted as requiring direct contact of the components for it is possible one or more intermediate components, layers or coatings may be positioned between the select components unless otherwise specified. More specifically, positional relationships, unless specified otherwise, can be direct or indirect, and the present invention is not intended to be limiting in this respect.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which may be described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps may be repeated multiple times. Each pattern being printed on the wafer may be aligned to the previously formed patterns and slowly the conductors, insulators and selectively doped regions can be built up to form the final device.

In the interest of not obscuring the presentation of embodiments of the present invention, in the following detailed description, some processing steps or operations that are known in the art may have been combined together for presentation and for illustration purposes and in some instances, may have not been described in detail. In other instances, some processing steps or operations that are known in the art may not be described at all. It should be understood that the following description is rather focused on the distinctive features or elements of various embodiments of the present invention. Additionally noted is that like reference numerals are used to designate like components and/or features in the accompanying drawings.

Turning now to FIG. 1A, a cross-sectional view of semiconductor structure 100a illustrating an example embodiment of conformal dielectric cap 102 is depicted, in accordance with embodiments of the present disclosure. In embodiments, semiconductor structure 100a may be configured using a subtractive top via integration scheme. Such schemes allow for metal contacts (e.g., first metal contact 108 and second metal contact 110) to be formed (e.g., etched) from a sheet of metal deposited on substrate 101. Conformal dielectric cap 102 may be configured to electrically separate a first area 104 of semiconductor structure 100a from a second area 106 of semiconductor structure 100a (e.g., and similarly semiconductor structure 100b of FIG. 1B).

In embodiments, semiconductor structure 100a may be designed to have one or more metal contacts, such as first metal contact 108 and second metal contact 110. While embodiments contemplated herein often refer to and depict only two metal contact structures (e.g., first metal contact 108 and second metal contact 110), such embodiments are examples only and as such should not be considered limiting. Similarly, semiconductor structures 100a and 100b, may include metal contacts having any combination of cuts, lines and/or vias. First metal contact 108 and second metal contact 110 may be composed of any conductive material, such as Rubidium (Ru), Molybdenum (Mo), and Cobalt (Co).

In embodiments, first metal contact 108 and second metal contact 110 may be configured to vertically extend from substrate 101. In some embodiments, a metal contact may have a top via. In such embodiments, a portion of first metal contact 108 may vertically extend from substrate 101 to a vertical height approximately the height of top portion 112 of semiconductor structure 100a. Metal contacts, such as first contact 108, that vertically extend to a vertical height approximately the height of top portion 112 may have an exposed surface at top portion 112 of semiconductor structure 100b.

In embodiments, dielectric cap 102 (e.g., conformal dielectric cap) may be conformed independently around each of the metal contacts, first metal contact 108 and second metal contact 110. As referenced herein dielectric cap 102 may be configured to electrically separate a first area 104 from a second area 106. Dielectric cap 102 may have a total layer thickness of approximately 5 nm. In some embodiments, dielectric cap 102 may be comprised of high-k dielectric layer 116 and low-k dielectric layer 118. In semiconductor structure 100a, the high-k dielectric layer 116 may cover first metal contact 108 and second metal contact 110 and extends to cover portions of substrate 101 not obscured by metal contacts. High-k dielectric layer 116 may have a layer thickness of approximately 2 nm. By adding high-k dielectric layer 116 as an additional layer to dielectric cap 102, the resulting capacitance may be increased by about 9%. For example, using a high-k dielectric material, such as AlN having a k value of 7.0, instead of a traditional dielectric (e.g., with a k values of about 4.0), the capacitance may be increased form about 0.273 fF/um to about 0.300 fF/um (e.g., a reduction of approximately 9%). In some embodiments, this resulting RC degrade may be offset by increasing a metal line CD (e.g., second metal contact 110) by about 0.5 nm. Such an increase may be allowed in structure designs where minims are not a concern.

Low-k dielectric layer 118 may be positioned directly above high-k dielectric layer 116. Low-k dielectric layer 118 may have a layer thickness of approximately 3 nm (e.g., the dielectric gap 102 having a combined layer thickness of 5 nm). This combination of high-k dielectric layer 116 and low-k dielectric layer 118 to form dielectric cap 102 may act to hermetically seal first area 104 from second area 106. For example, in semiconductor structure 100a, first area 104 may include the first metal contact 108 and second metal contact 110, while second area 106 may include a low-k dielectric backfill layer 114. In some embodiments, low-k dielectric backfill layer 114 may be composed of ultra low-k (ULK) dielectric layer.

In embodiments where a pitch associated with the first metal contact 108 and second metal contact 110 is determined to be a nominal pitch, an airgap may be formed in semiconductor structure 100a. While the airgap structure is not depicted in semiconductor structure 100a, directional arrow 120 indicates the location in the structure where an airgap is likely to form. The airgap, as indicated with directional arrows 120, may be formed when dielectric cap 102 pinches off during formation.

Figure 1B:
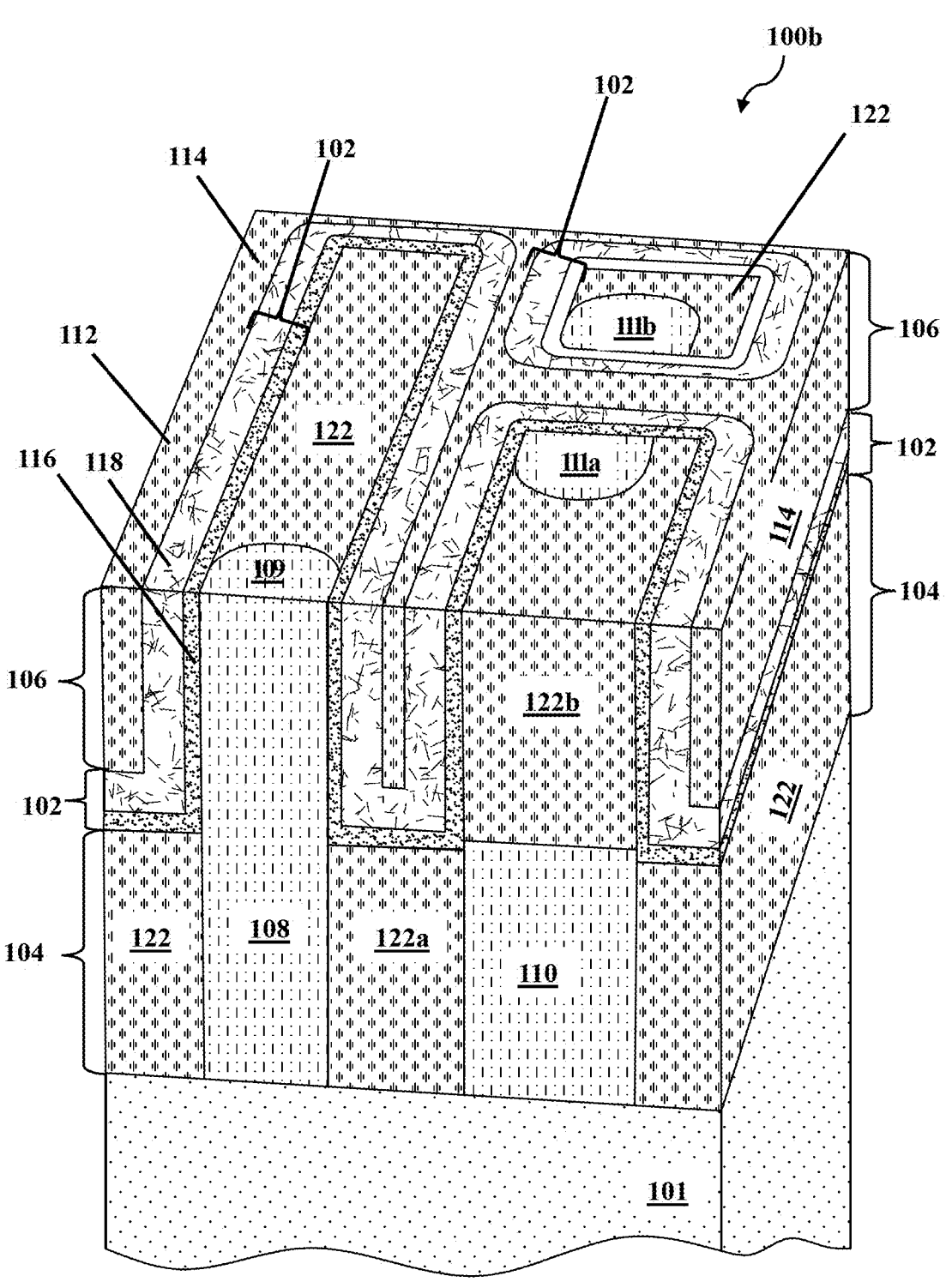
FIG. 1B depicts a schematic view of an alternative embodiment of a semiconductor structure, in accordance with embodiments of the present disclosure.

Turning to FIG. 1B, a cross-sectional view of semiconductor structure 100b illustrating another example embodiment of conformal dielectric cap 102 is depicted, in accordance with embodiments of the present disclosure. Similar patterned textures and identifiers denote similar structures and features between FIG. 1A and FIG. 1B. FIG. 1B and corresponding semiconductor structure 100b has the same or similar features as disclosed in reference to semiconductor structure 100a of FIG. 1A, unless explicitly stated.

In embodiments, first area 104 of semiconductor structure 100b may include first metal contact 108 and second metal contact 110 as well as an ultra low-k (ULK) dielectric layer 122. ULK dielectric layer 122 may be anisotropically positioned vertically on one or more horizontal surfaces (e.g., exposed portions of substrate 101 and the one or more metal contacts) positioned adjacent to first metal contact 108 and second metal contact 110. While ULK dielectric layer 122 may have a uniform thickness, depending on the height of the one or more horizontal surfaces, the ULK dielectric layer may be positioned at different levels. For example, ULK dielectric layer 122a may be positioned adjacent or between first metal contact 108 and second metal contact 110, while ULK dielectric layer 122b positioned is higher than ULK dielectric layer 122 on a line of second metal contact 110 they are considered the same layer. The vertical height of ULK dielectric layer 122 may be based at least in part on predetermined design parameters. Despite the level ULK dielectric layer 122 is positioned at, ULK dielectric layer 122 is a component of first area 104 because it is hermetically separated from second area 106 by dielectric cap 102. In embodiments, low-k dielectric backfill layer 124 may be positioned directly over dielectric cap 102. Low-k dielectric backfill layer 124 may be composed of one or more dielectrics having an ultra low-k. In embodiments, there may be one or more exposed portions of first metal contact 108 (e.g., exposed contact portion 109) and/or second metal contact 110 (e.g., exposed contact portions 111*a* and 111*b*).

FIGS. 2A-2E, schematically illustrate a process flow for forming dielectric cap (e.g., dielectric cap 102 in FIGS. 1A-1B) structure in a semiconductor structure 200, in accordance with embodiments of the present disclosure.

Figure 2A:
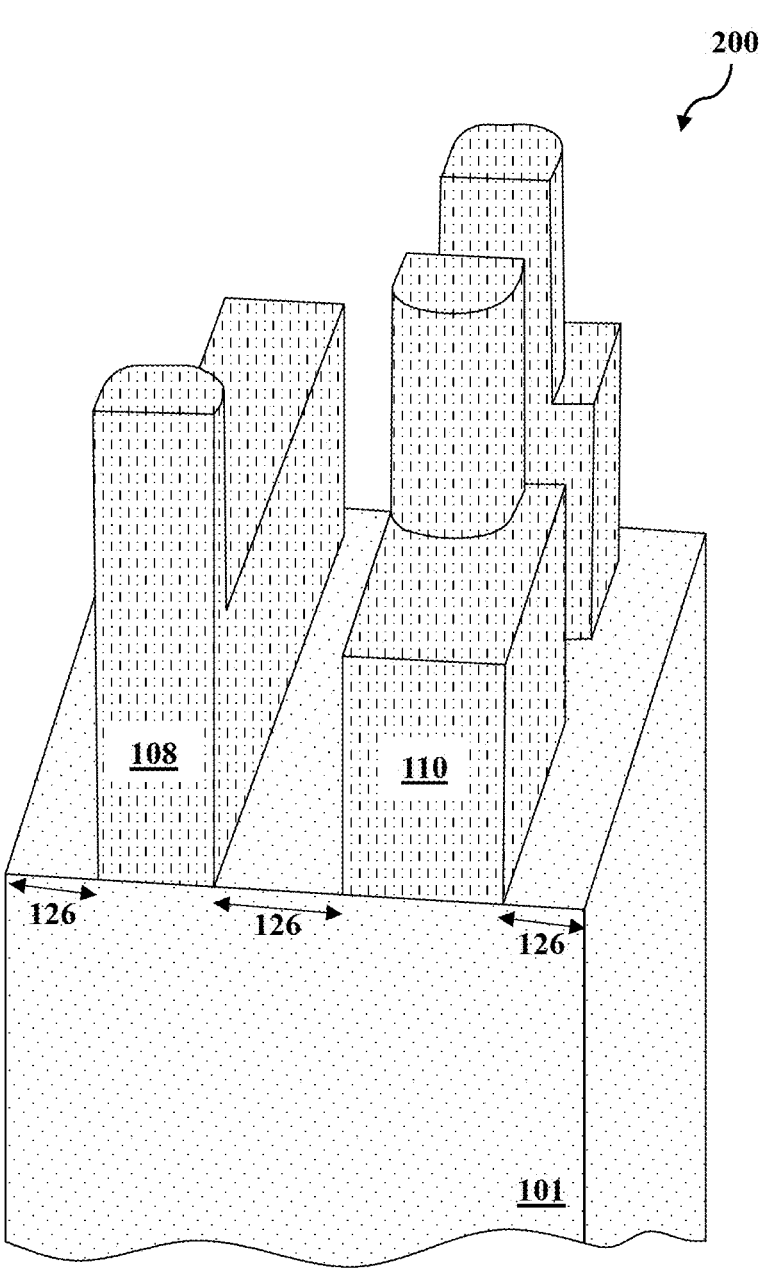
FIG. 2A schematically illustrates a process flow for forming a semiconductor device, in accordance with embodiments of the present disclosure.

Turning now to FIG. 2A, a process flow for forming a semiconductor device having a dielectric cap is depicted, in accordance with embodiments of the present disclosure. In embodiments, first metal contact 108 and second metal contact 110 may be etched into a metal sheet configured on substrate 101. As a result, one or more exposed portions 126 of substrate 101 and one or more metal contacts vertically extended from substrate 101 may be formed on substrate 101.

Figure 2B:
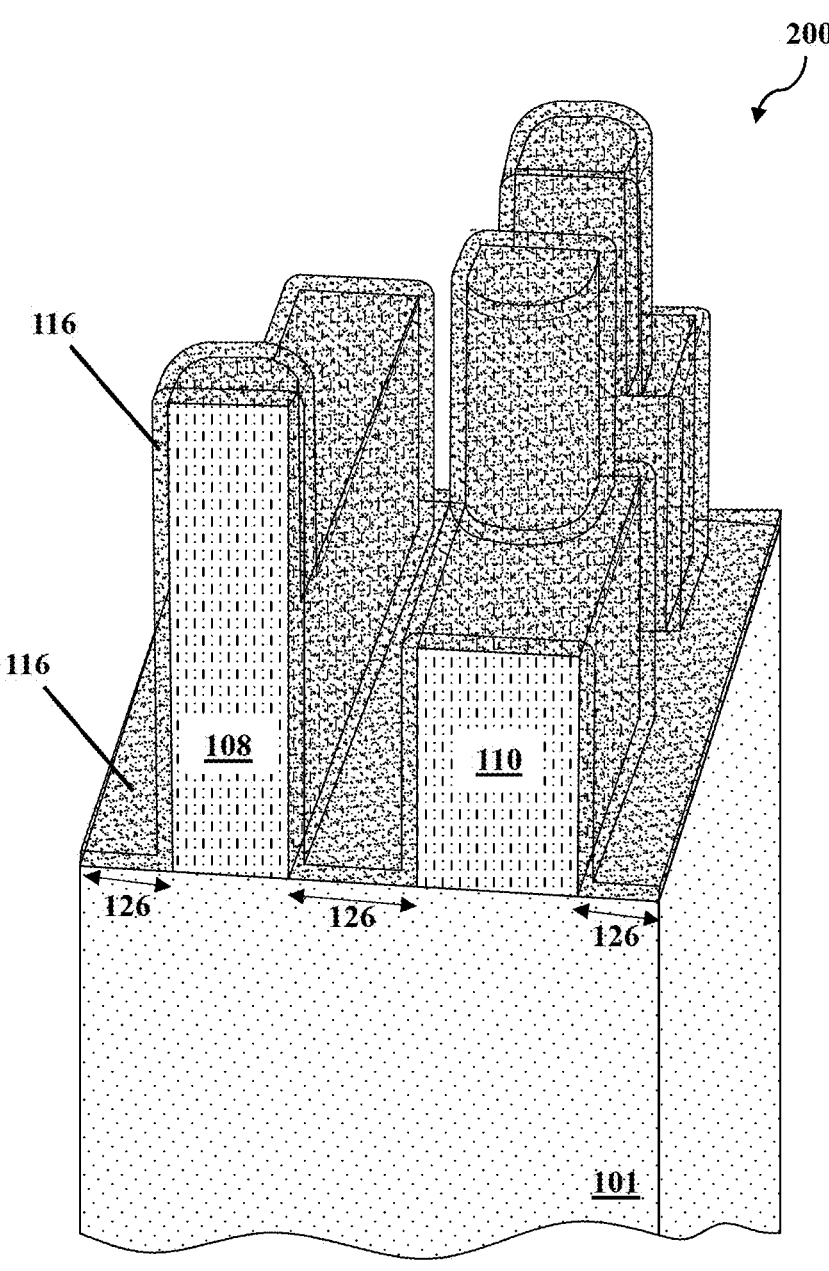
FIG. 2B schematically illustrates a continuation of the process flow for a semiconductor device, in accordance with embodiments of the present disclosure.

Turning now to FIG. 2B, a continuation of the process flow for a semiconductor device is depicted, in accordance with embodiments of the present disclosure. More particularly, FIG. 2B illustrates the initial process of forming a dielectric cap over one or more exposed portions 126 of substrate 101 and the one or more metal contacts (e.g., first metal contact 108 and second metal contact 110). In embodiments, a high-k dielectric layer may be deposited over the one or more exposed portions of substrate and over the one or more metal contacts. High-k dielectric layer 116 may be deposited over the one or more exposed portions 126 of substrate 101 and over the one or more metal contacts with a thickness of approximately 2 nm.

Figure 2C:
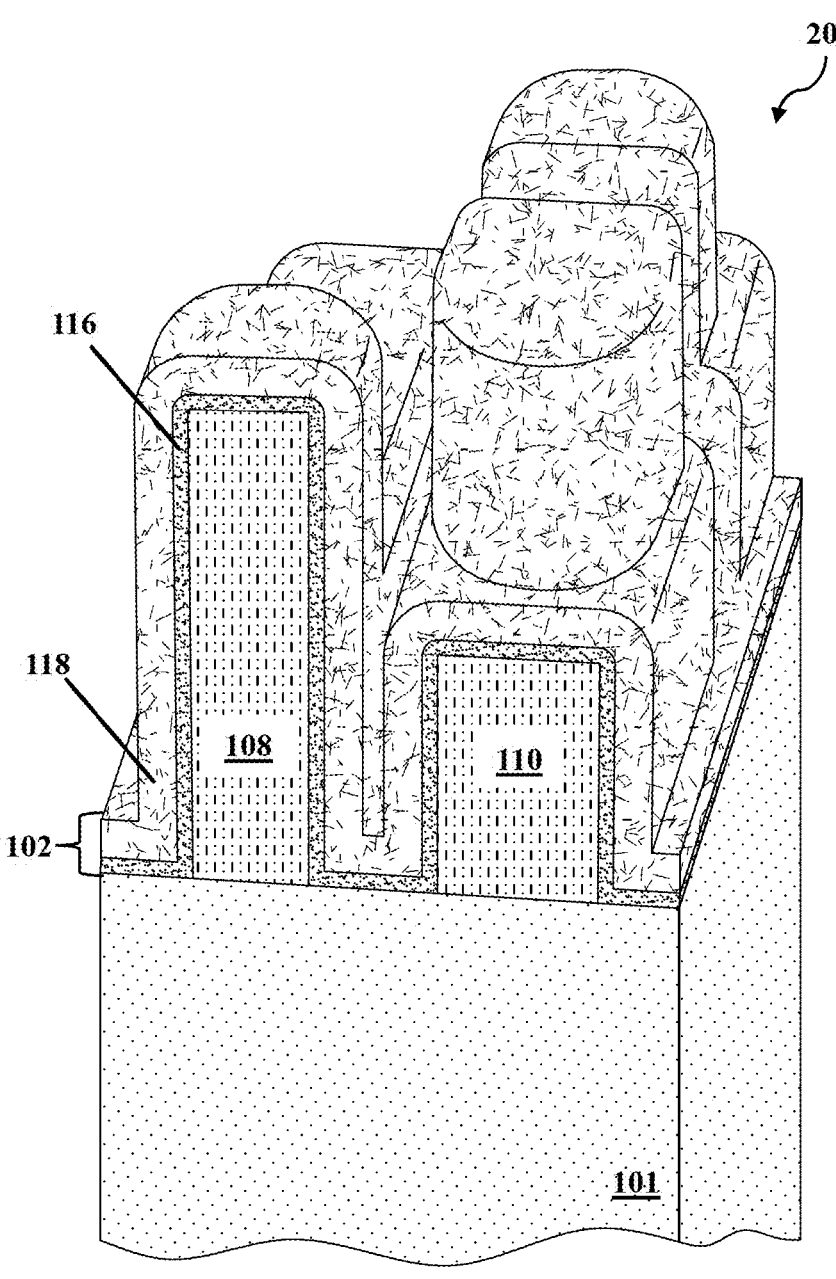
FIG. 2C schematically illustrates another continuation of the process flow for forming a semiconductor device, in accordance with embodiments of the present disclosure.

Turning now to FIG. 2C, another continuation of the process flow for a semiconductor device is depicted, in accordance with embodiments of the present disclosure. More particularly, FIG. 2C illustrates the continuation of the process of forming dielectric cap. In embodiments, a low-k dielectric layer 118 may be deposited over high-k dielectric layer 116. Low-k dielectric layer 118 may be deposited over high-k dielectric layer 116 with a thickness of approximately 3 nm. Low-k dielectric layer 118 and high-k dielectric layer 116 are combined to form conformal dielectric cap 102.

Figure 2D:
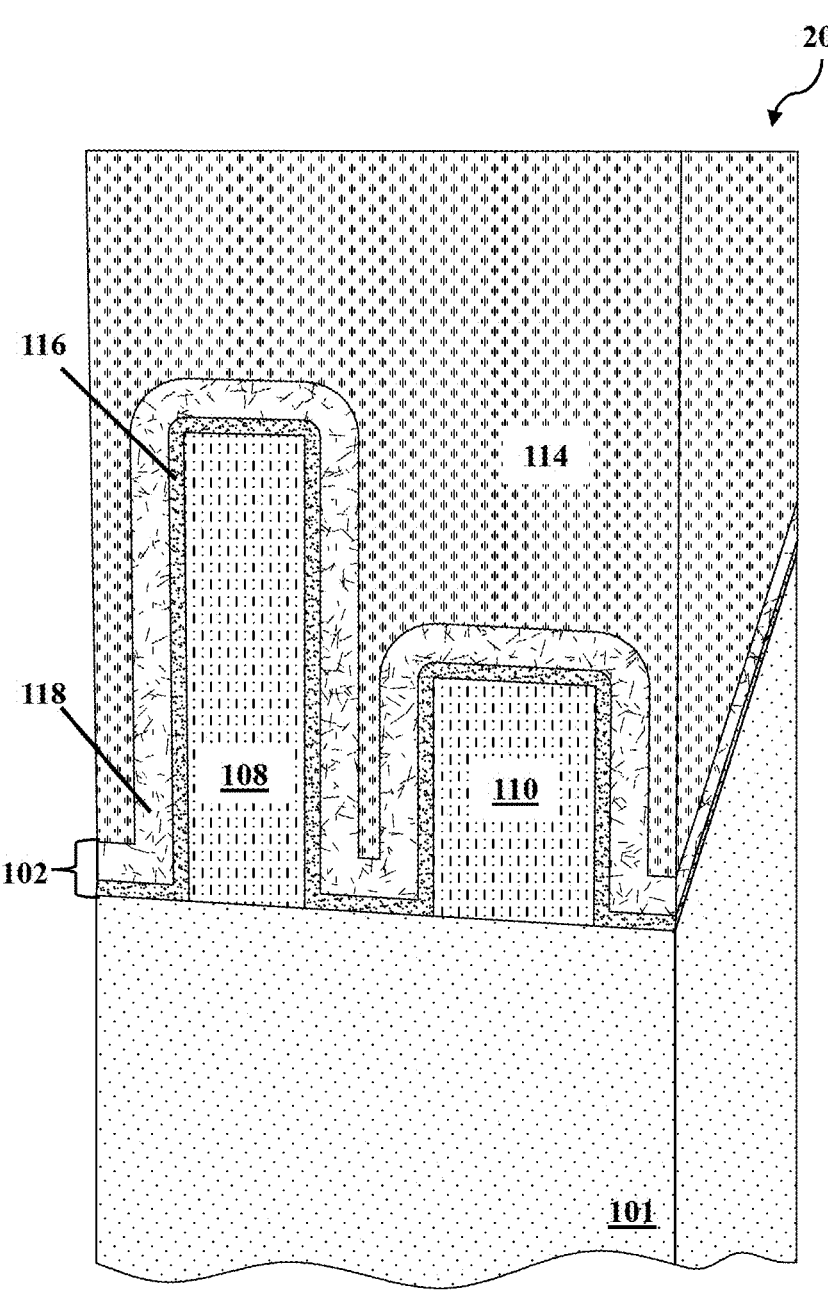
FIG. 2D schematically illustrates another continuation of the process flow for forming a semiconductor device, in accordance with embodiments of the present disclosure.

Turning now to FIG. 2D, another continuation of the process flow for a semiconductor device is depicted, in accordance with embodiments of the present disclosure. In embodiments, a low-k dielectric backfill layer 114 may be deposited/backfilled over dielectric cap 102.

Figure 2E:
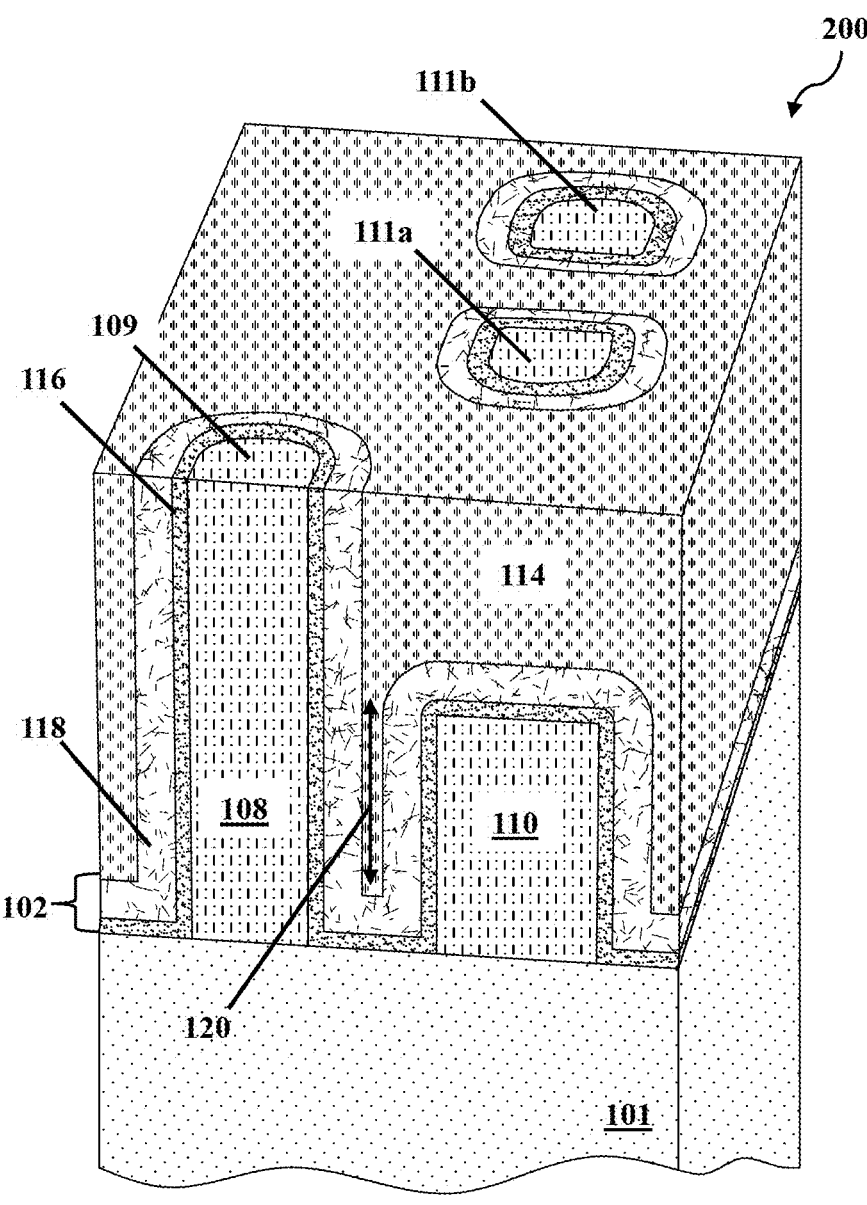
FIG. 2E schematically illustrates another continuation of the process flow for forming a semiconductor device, in accordance with embodiments of the present disclosure.

Turning now to FIG. 2E, another continuation of the process flow for a semiconductor device is depicted, in accordance with embodiments of the present disclosure. In embodiments, an amount of low-k dielectric backfill layer 114 and other relevant layers (e.g., dielectric cap 102) may be removed with a polishing process. This polishing process may expose or reveal an exposed contact portion of the one or more contacts. In embodiments, the exposed contact portions (e.g., exposed contact portion 109 and other exposed contact portion 111*a* and 111*b*) proximate a top portion of the semiconductor structure.

In some embodiments, an airgap, depicted by directional arrow 120, may be formed between first metal contact 108 and second metal contact 110 of the one or more metal contacts on substrate 101. In such embodiments, dielectric cap 102 may be pinched-off to form airgap 120 between first metal contact 108 and second metal contact 110. The formation of airgap 120 may result in an increase in capacitance of approximately 9%.

FIGS. 3A-3E, schematically illustrates another example embodiment of a process flow for forming dielectric cap (e.g., dielectric cap 102 in FIGS. 1A-1B) structure in a semiconductor structure 300, in accordance with embodiments of the present disclosure.

Figure 3A:
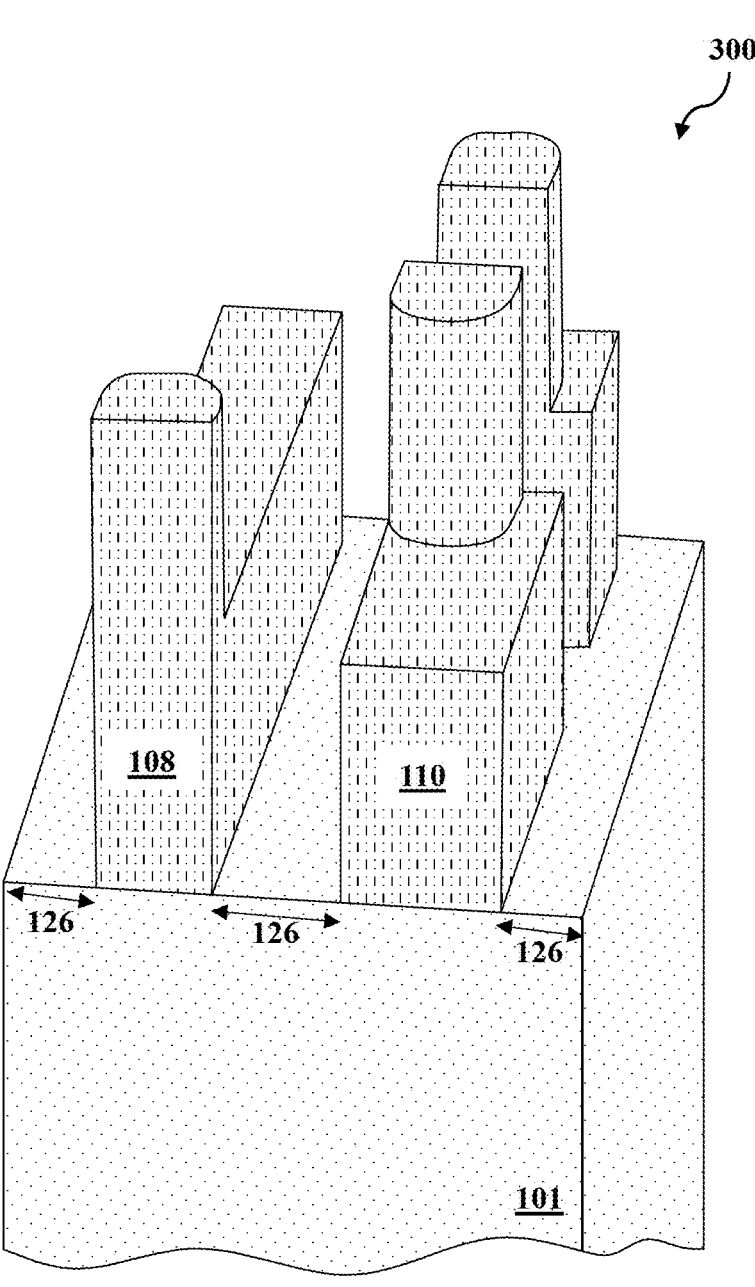
FIG. 3A schematically illustrates a process flow for forming a semiconductor device, in accordance with embodiments of the present disclosure.

Turning now to FIG. 3A, a process flow for forming a semiconductor device having a dielectric cap is depicted, in accordance with embodiments of the present disclosure. In embodiments, first metal contact 108 and second metal contact 110 may be etched into a metal sheet configured on substrate 101. As a result, one or more exposed portions 126 of substrate 101 and one or more metal contacts vertically extended from substrate 101 may be formed on substrate 101.

Figure 3B:
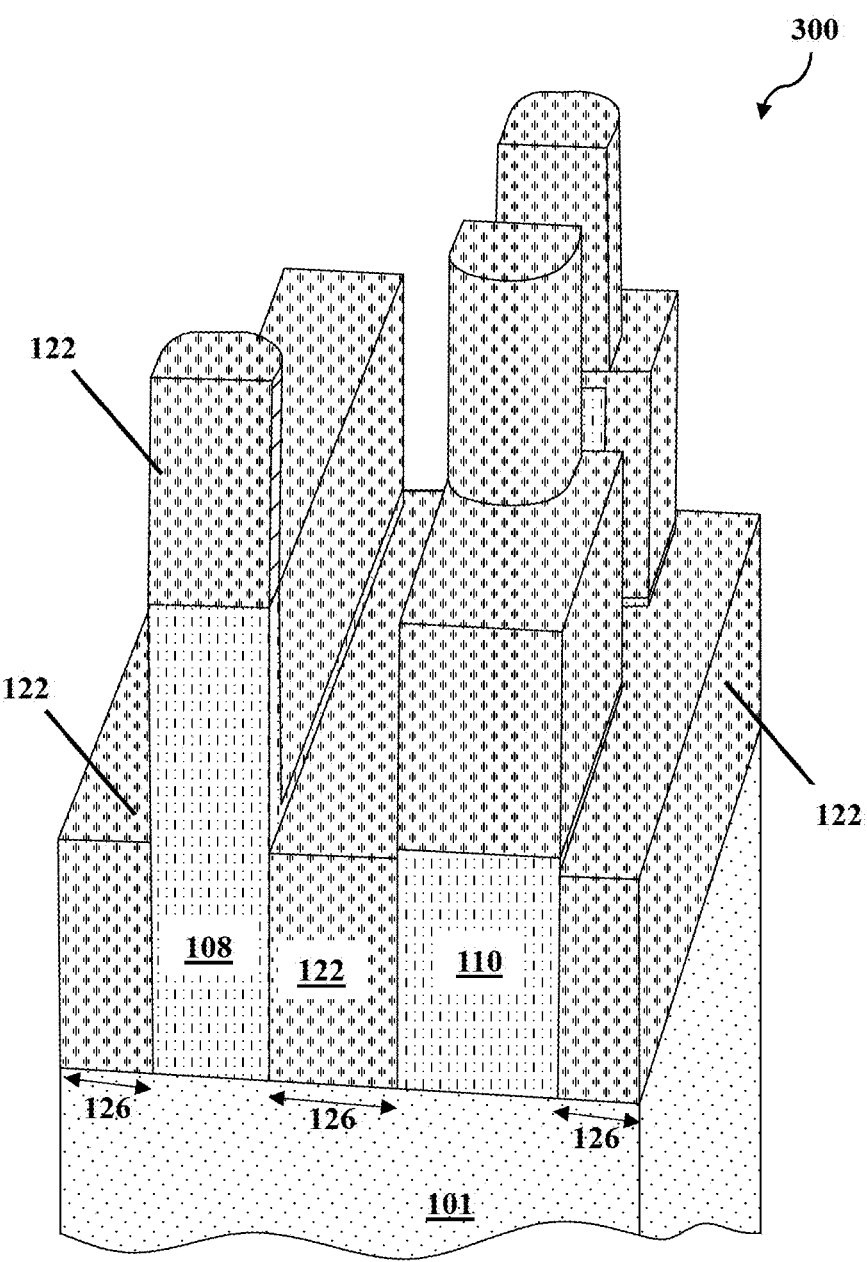
FIG. 3B schematically illustrates a continuation of the process flow for a semiconductor device, in accordance with embodiments of the present disclosure.

Turning now to FIG. 3B, a continuation of the process flow for a semiconductor device is depicted, in accordance with embodiments of the present disclosure. In embodiments, ULK dielectric layer 122 is anisotropically deposited over the one or more exposed portions of the substrate and over one or more horizontal surfaces (e.g., first surface portion or horizontal surfaces) of the one or more metal contacts (e.g., first metal contact 108, and second metal contact 110). The ULK dielectric layer 122 is not formed on the second surface portion, or one or more vertical surfaces, of the one or more metal contacts.

Figure 3C:
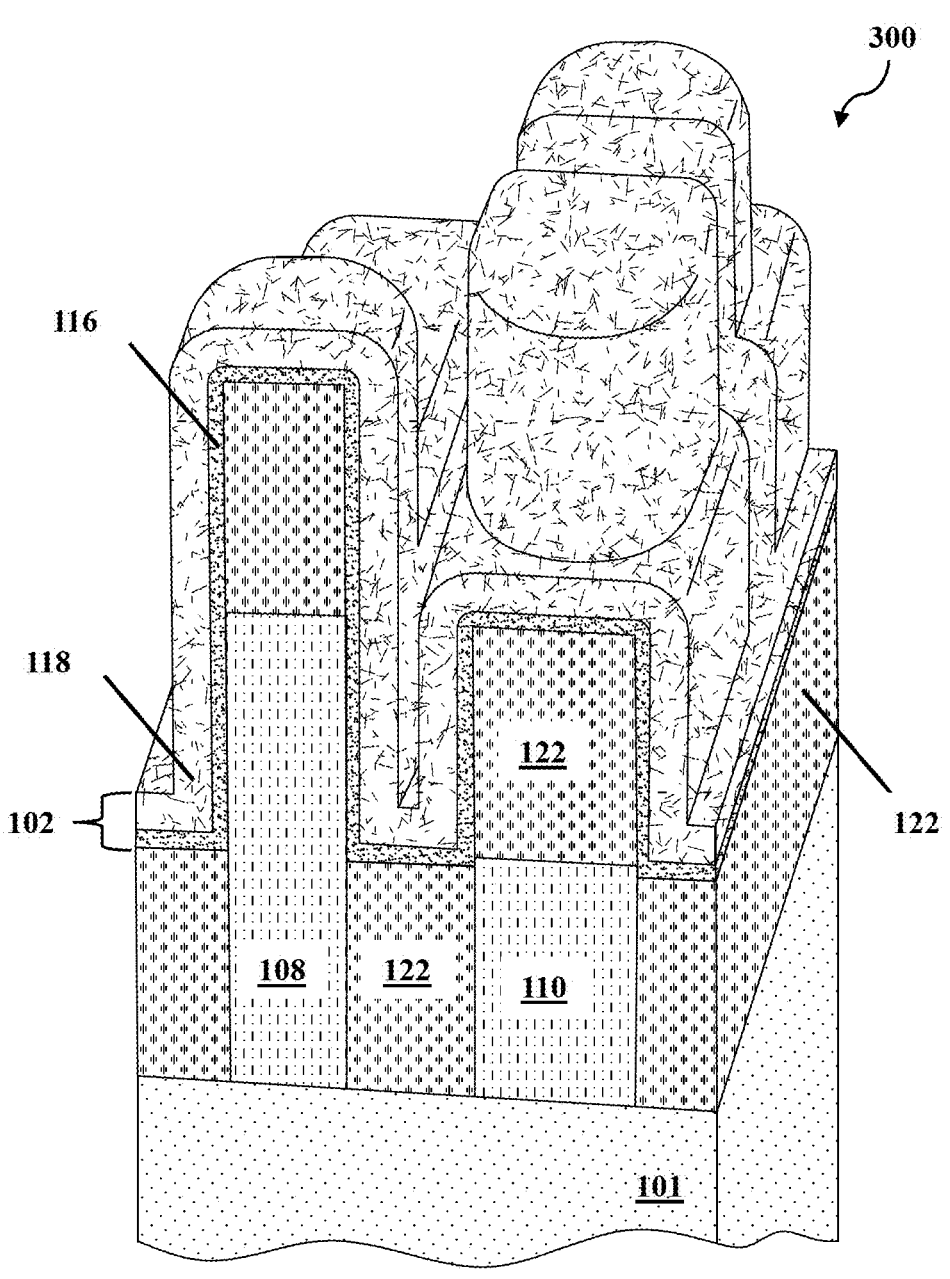
FIG. 3C schematically illustrates another continuation of the process flow for forming a semiconductor device, in accordance with embodiments of the present disclosure.

Turning now to FIG. 3C, a continuation of the process flow for a semiconductor device is depicted, in accordance with embodiments of the present disclosure. In embodiments, dielectric cap 102 may be formed over the ULK dielectric layer and the second surface portion of the one or more metal contacts. In embodiments, a high-k dielectric layer may be deposited over the one or more exposed portions of substrate and over the one or more metal contacts. High-k dielectric layer 116 may be deposited over the one or more exposed portions 126 of substrate 101 and over the one or more metal contacts with a thickness of approximately 2 nm. In embodiments, a low-k dielectric layer 118 may be deposited over high-k dielectric layer 116. Low-k dielectric layer 118 may be deposited over high-k dielectric layer 116 with a thickness of approximately 3 nm. Low-k dielectric layer 118 and high-k dielectric layer 116 are combined to form conformal dielectric cap 102.

Figure 3D:
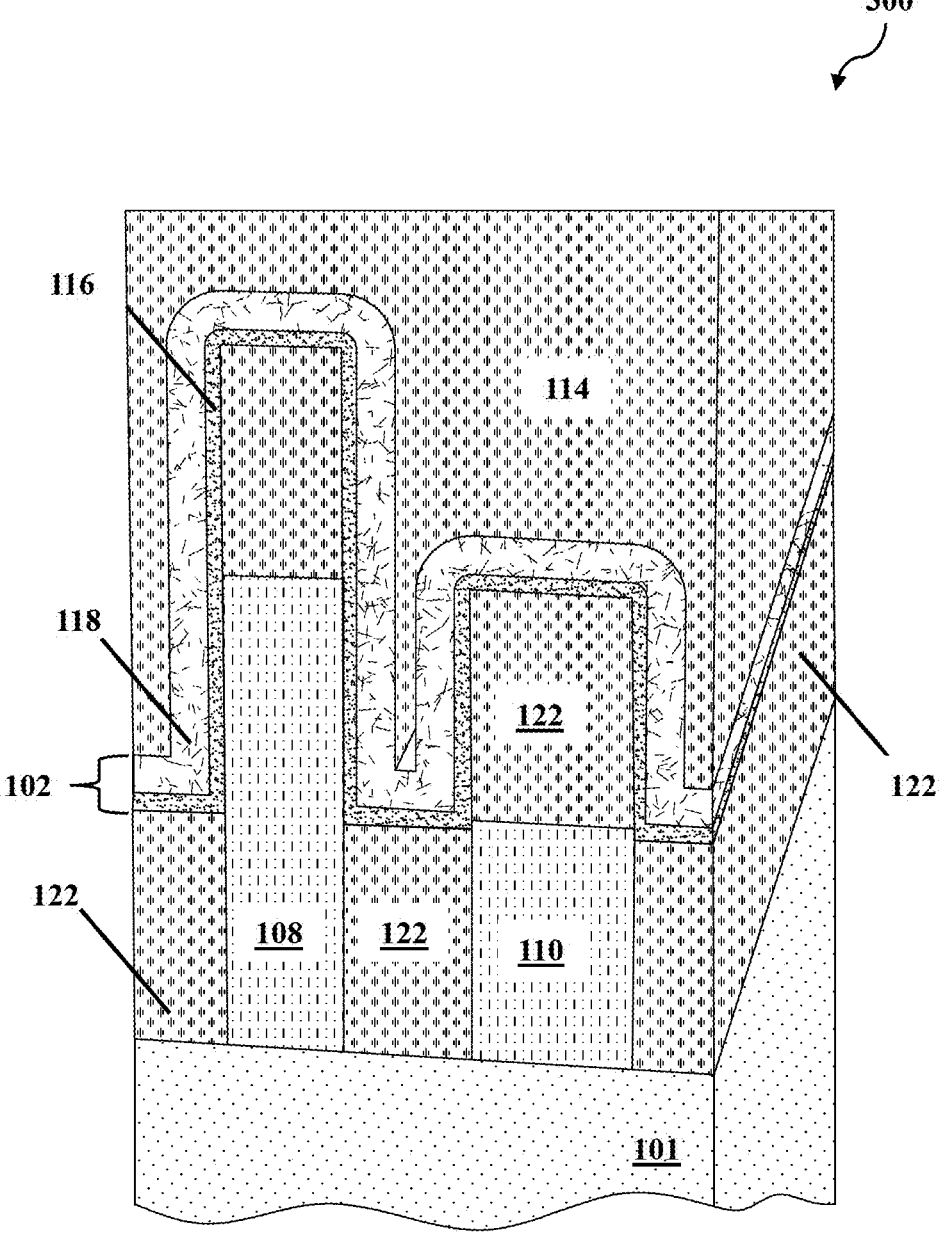
FIG. 3D schematically illustrates another continuation of the process flow for forming a semiconductor device, in accordance with embodiments of the present disclosure.

Turning now to FIG. 3D, another continuation of the process flow for a semiconductor device is depicted, in accordance with embodiments of the present disclosure. In embodiments, a low-k dielectric backfill layer 114 may be deposited/backfilled over dielectric cap 102.

Figure 3E:
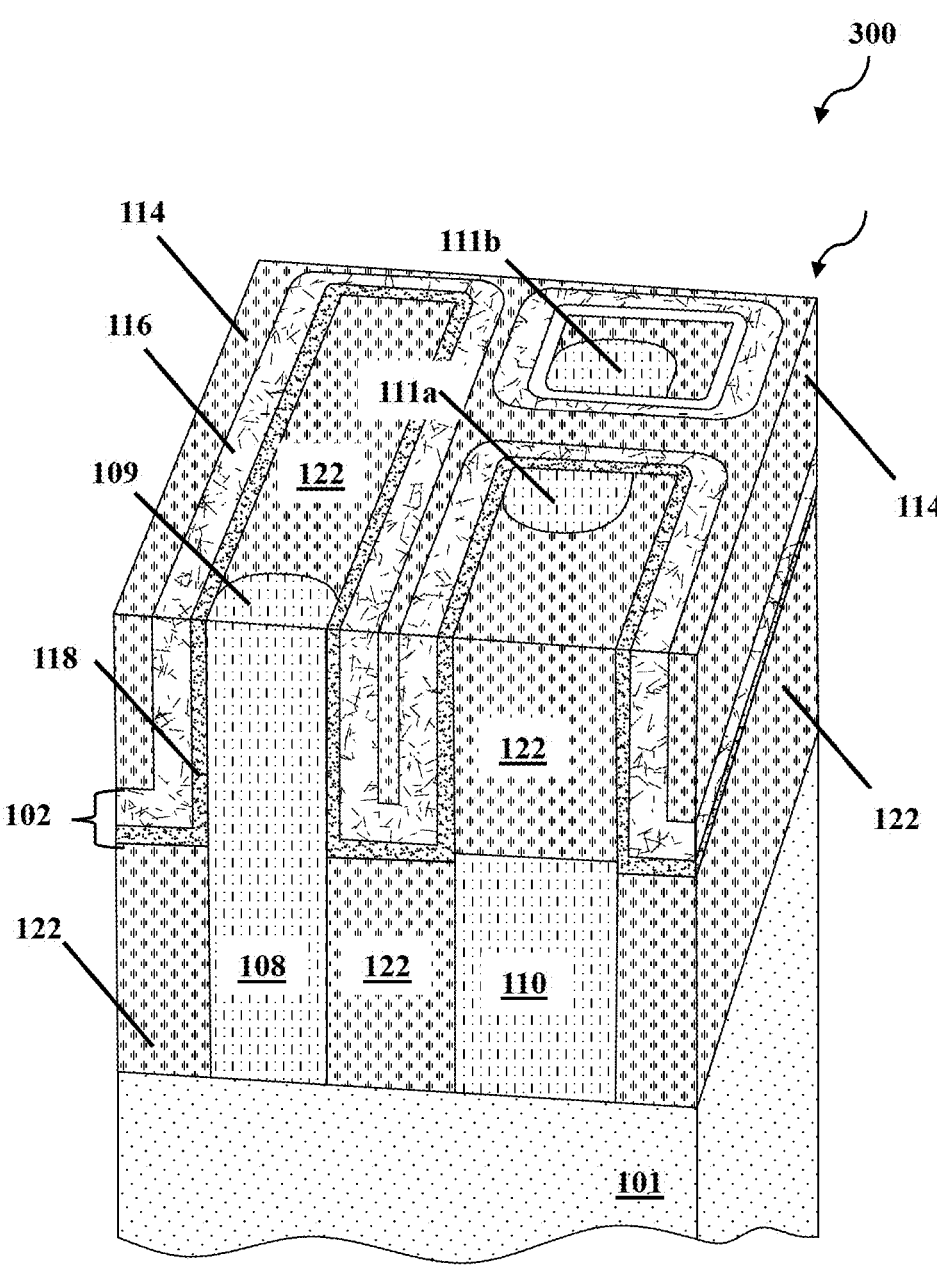
FIG. 3E schematically illustrates another continuation of the process flow for forming a semiconductor device, in accordance with embodiments of the present disclosure.

Turning now to FIG. 3E, another continuation of the process flow for a semiconductor device is depicted, in accordance with embodiments of the present disclosure. In embodiments, an amount of low-k dielectric backfill layer 114 and other relevant layers (e.g., dielectric cap 102) may be removed with a polishing process. This polishing process may expose or reveal an exposed contact portion of the one or more contacts. The exposed contact portion of the one or more metal contracts may be proximate to a top portion of semiconductor structure 300. In embodiments, the exposed contact portions (e.g., exposed contact portion 109 and other exposed contact portion 111*a* and 111*b*) proximate a top portion of the semiconductor structure.

By forming dielectric cap 102 around the via (e.g., via of first metal contact), the line to line capacitance penalty is reduced while the advantage associated with higher operating $V_{max}$ levels. Because the line to line capacitance is often more than 70% of the total capacitance, the impact of the vertical capacitance increase will not be significant, allowing the associated fringing field to be the same or similar to a traditional dielectric cap.

Figure 4:
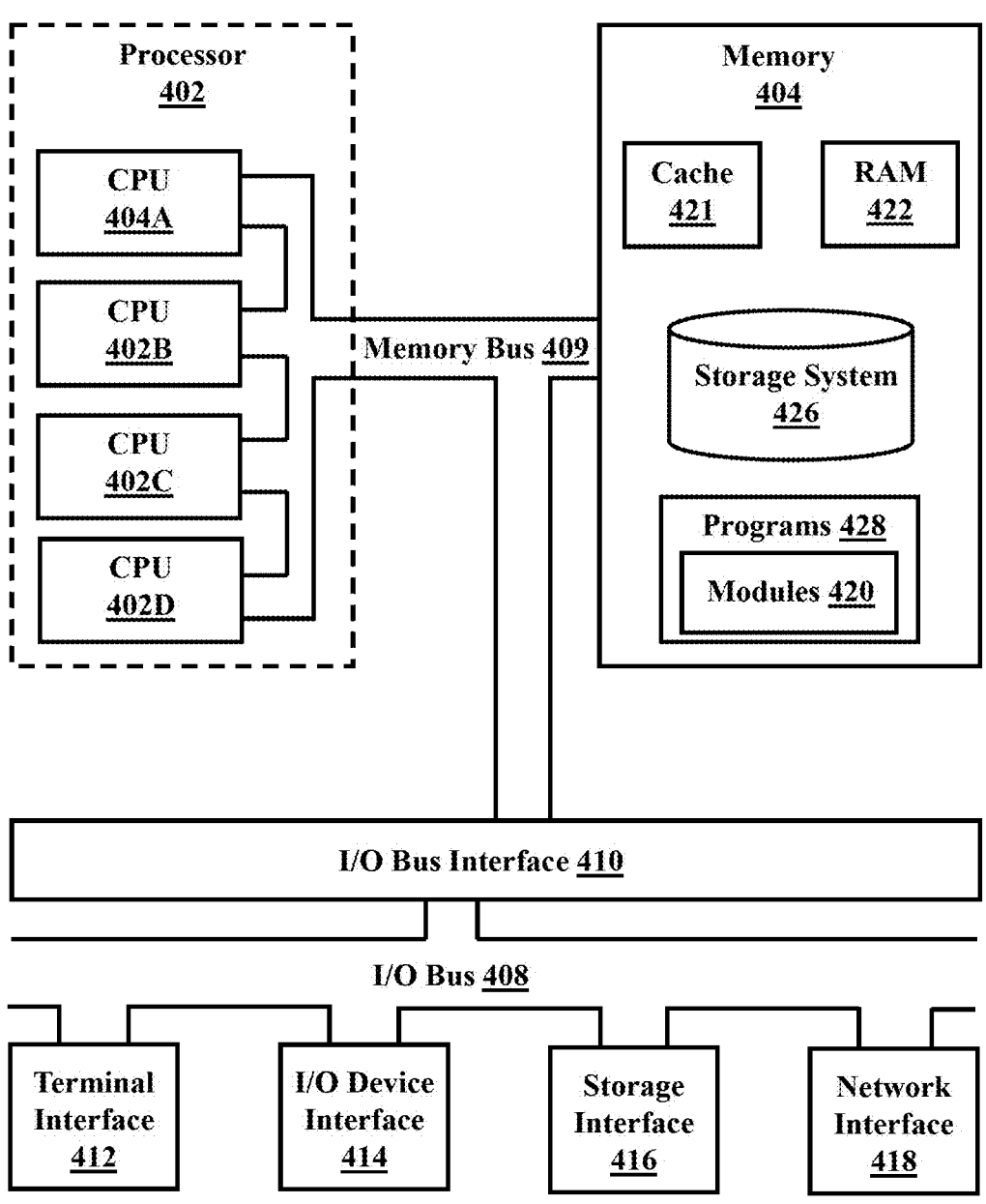
FIG. 4 illustrates a high-level block diagram of an example computer system that may be used in implementing one or more of the methods, tools, and modules, and any related functions, described herein, in accordance with embodiments of the present disclosure.

It is noted that FIG. 4 is intended to depict the representative major components of an exemplary computer system

401. In some embodiments, however, individual components may have greater or lesser complexity than as represented in FIG. 4, components other than or in addition to those shown in FIG. 4 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A semiconductor structure, the semiconductor structure comprising:
   a first metal contact, wherein at least a portion of the first metal contact vertically extends from a substrate to a top portion of the semiconductor structure, the first metal contact having a side and an exposed surface at the top portion of the semiconductor structure; and
   a dielectric cap configured around the first metal contact, wherein the dielectric cap is configured to electrically separate a first area of the semiconductor structure from a second area of the semiconductor structure, and wherein the first area of the semiconductor structure includes the first metal contact,
   wherein the dielectric cap includes a high-k dielectric layer and a low-k dielectric layer, and wherein the high-k dielectric layer includes a first side that directly contacts and extends along the side of the first metal contact and extends to be in direct contact with, and extends parallel to, portions of the substrate not obscured by the first metal contact, and the low-k dielectric layer directly contacts and extends along a second side of the high-K dielectric layer, that is opposite the first side of the high-k dielectric layer, in parallel to the portions of the substrate not obscured by the first metal contact.

2. The semiconductor structure of claim 1, wherein the low-k dielectric layer is positioned directly over the high-k dielectric layer.

3. The semiconductor structure of claim 1, wherein the second area of the semiconductor structure includes a second ULK dielectric layer, wherein the second area of the semiconductor structure is directly positioned over the dielectric cap.

4. The semiconductor structure of claim 1, further comprising:
   a second metal contact vertically extended from the substrate, wherein the second metal contact is configured in the first area of the semiconductor structure.

5. The semiconductor structure of claim 4, wherein the second area of the semiconductor structure further includes an airgap positioned between the first metal contact and the second metal contact.

6. The semiconductor structure of claim 1, wherein the dielectric cap has a thickness of approximately 5 nm.

7. The semiconductor structure of claim 4, wherein the first side of the high-k dielectric layer directly contacts and extends along the side of the second metal contact and extends to be in direct contact with, and extends parallel to, portions of the substrate not obscured by the second metal contact.

8. The semiconductor structure of claim 7, wherein the low-k dielectric layer directly contacts and extends along a second side of the high-K dielectric layer, that is opposite the first side of the high-k dielectric layer, in parallel to the portions of the substrate not obscured by the second metal contact.

* * * * *